United States Patent [19]

Ng

[11] Patent Number: 4,471,378
[45] Date of Patent: Sep. 11, 1984

[54] LIGHT AND PARTICLE IMAGE INTENSIFIER

[75] Inventor: Sing Tai Ng, Erie, Pa.

[73] Assignee: American Sterilizer Company, Erie, Pa.

[21] Appl. No.: 108,681

[22] Filed: Dec. 31, 1979

[51] Int. Cl.$^3$ .................... H04N 5/30; H04N 5/32; H04N 5/33

[52] U.S. Cl. .................... 358/110; 358/111; 358/113; 358/209; 358/211; 358/213; 358/217

[58] Field of Search ............ 358/110, 111, 113, 209, 358/211, 213, 217; 313/377

[56] References Cited

U.S. PATENT DOCUMENTS

| | | | |
|---|---|---|---|
| 3,283,159 | 11/1966 | Robbins | 358/211 |
| 3,461,340 | 8/1969 | Charles | 313/377 |
| 3,495,084 | 2/1970 | Sheldon | 358/110 |
| 3,553,457 | 1/1971 | Manley | 358/110 |
| 3,612,762 | 10/1971 | Wuellner | 358/211 |
| 3,651,489 | 3/1972 | Beutel | 358/213 |
| 3,716,747 | 2/1973 | Patel | 358/213 |
| 3,790,785 | 2/1974 | Paolini | 358/211 |
| 3,806,729 | 4/1974 | Caywood | 358/113 |
| 3,851,096 | 11/1974 | Collins | 358/213 |
| 4,081,214 | 3/1978 | Van Buskirk | 358/110 |
| 4,142,207 | 2/1979 | McCormack | 358/213 |

OTHER PUBLICATIONS

Currie, "An Intensified Charge Coupled Device for Extremely Low Light Level Operation", pp. 155-163 of 1975 *International Conference on the Application of Charge-Coupled Devices Record*, (San Diego, Calif., USA, 29-31, Oct. 1975).

Brown, "The Charge-Coupled Device as a TV Image Sensor", *GEC Journal of Science and Technology*, vol. 43, No. 3, 1977, pp. 125-133.

*Primary Examiner*—Howard Britton
*Attorney, Agent, or Firm*—Robert D. Yeager; Andrew J. Cornelius

[57] ABSTRACT

A light and charged particle image intensifier receives incident image conveying light or charged particles ("incident beam") and provides to data processing and video equipment signals from which the image conveyed by the incident beam can be constructed and displayed. The beam that is being processed includes visible light reflected from objects and X-ray radiation that has been passed through an object such as a human body. The image intensifier includes a scintillator and photocathode unit for converting the incident beam to photoelectrons and a charge-coupled device ("CCD") for detecting the photoelectrons and transmitting to the data processing and video equipment information relating to the quantity or energy level as well as the location of the electrons impinging on the sensing areas of the CCD. From this information, the data processing and video equipment can reconstruct the image conveyed by the incident beam. The sensitivity of the device is increased either by imposing an electric field across the photocathode and the CCD to accelerate the photoelectrons or by placing a micro channel plate ("MCP") between the photocathode and the CCD to increase the number of electrons that impinge on the CCD. Alternately, a silicon diode target can be used instead of a CCD to intercept the electrons and an electron beam gun can be used to detect the location and intensity of the charges created on the target by the impinging electrons. Finally, a grid having a number of windows can be used instead of a CCD or a silicon target to detect the location of the electron streams and a photoanode can detect their intensity.

28 Claims, 7 Drawing Figures

LIGHT AND PARTICLE IMAGE INTENSIFIER

BACKGROUND OF THE INVENTION

1. Field of the Invention

This invention relates generally to imaging devices and more particularly to a device for detecting image conveying light or particles ("beam") and transmitting to data processing and video equipment information needed by that equipment to display on a CRT the image carried by the beam.

2. Description of the Prior Art

Generally, two types of devices have been used to produce images from particle or light sources—devices producing images on photographic film and image intensifiers. Although an image having good resolution can be obtained on light-sensitive film, the time required to process the film is relatively long and prohibitive for many applications. Further, a dynamic image of the object under examination cannot be obtained through the use of light-sensitive film.

Although an image of an object can be obtained quickly using conventional image intensifiers, the resolution of the image (4 line pairs/mm) is unacceptable for many applications. For example, the medical profession generally considers X-ray images having only 4 line pairs/mm resolution to be unacceptable as an aid in examining the human body, and so conventional X-ray image intensifiers have not been heavily relied upon as a means for obtaining X-ray images of portions of the human body.

Finally, conventional X-ray equipment, including equipment employing X-ray sensitive film and X-ray image intensifiers, has been large and cumbersome and, therefore, has placed severe restrictions on the use of such equipment.

SUMMARY OF THE INVENTION

A light and particle ("beam") immage intensifier and a self-scanning charge-coupled device are provided that transmit quickly to data processing and video equipment information from which the image conveyed by the beam can be created and displayed. The image created by the present invention has a high resolution (approximately 10 line pairs/mm). The present invention also provides a dynamic image which is useful for examining moving objects. The present invention is compact and can be as thin as 2 to 3 inches.

The charge-coupled device disclosed herein can be used to detect particles directly and to transmit to data processing and video equipment information by which that equipment can reconstruct and display the image conveyed by such sources.

Although the present invention can be used to create and display an image conveyed by any type of light or particle source, it is particularly useful as an X-ray image intensifier. The high resolution of the image created by the present invention renders it useful as an aid to physicians and surgeons for examining the human body, to industry for examining structures for defects and to astronomers. One embodiment of the present invention provides an image intensifier that is approximately 6 inches in diameter and 2 inches thick and can be located on the under side of an operating table. Such an application allows a surgeon to view a dynamic image of any portion of a human body located on the table as the surgeon operates. The present invention is also useful to dentists since it can be as small as ¾ of an inch in diameter or smaller.

Further, the present invention can be used not only to create an image from an image conveying light or particle source but to accept external electrical signals and create an image therefrom. An example of such a device is an X-ray image intensifier that can receive gray-scale information from an ultrasonic transmitter/receiver and can convey that information to the same data processing and video equipment that is used to process the X-ray image information.

One embodiment of the present invention includes a scintillator/photocathode unit, a charge-coupled device ("CCD") and apparatus for imposing an electric field between the photocathode and CCD. The incident image conveying beam is converted to photoelectrons by the scintillator/photocathode unit. The photo-electrons are accelerated by the electric field and impact the sensing areas of the CCD, which is operating in the front electron bombardment mode. Information relating to the location and intensity of the charges created by the electrons impacting the sensing areas is conveyed by the CCD to the data processing and video equipment. This information is sufficient to permit the data processing and video equipment to construct and display the image conveyed by the incident beam. Alternately, a micro channel plate can be disposed between the photocathode and the CCD. The micro channel plate (MCP) improves the resolution of the image by channeling the electrons into a large number of relatively discrete streams and increases the contrast of the image by increasing the number of electrons impacting the sensing areas. If it is desired to use the CCD in the photon bombardment mode, a phosphor screen can be disposed in front of the CCD to convert the electrons to photons. Moreover, external image conveying electrical signals may be input to the CCD and passed to the data processing and video equipment and an image can be created therefrom. When the CCD is used in the electron bombardment mode, the areas of the CCD that are exposed to the electrons, other than the sensing areas, are shielded so that those areas do not become damaged by the electron stream.

In an alternate embodiment of the present invention, a silicon diode target is used instead of the CCD to intercept the electrons emitted by the photocathode and an electron beam gun scans the target to detect information relating to the presence and location of charges created on the target by the intercepted electrons and passes that information to the data processing and video equipment. An MCP is disposed between the photocathode and the target to provide improved sensitivity for the device.

Alternately, a target grid and photoanode can be used to detect the presence and location of the electrons emitted by the photocathode. The target grid scans the electrons flowing from the MCP by selectively and systemically allowing portions of the stream to pass through one window of the grid at a time. These portions impact the photoanode and the photoanode passes the information relating to intensity and location of the electrons to the data processing and video equipment.

It should be noted that the scintillator should be eliminated when the image intensifier is used to detect visible light.

The scintillator, photocatode and MCP and not needed if it is desired to use the CCD to detect particles directly.

In this application, the term "light" shall be construed to include X-ray radiation, visible light, gamma-ray radiation, ultraviolet light and infra-red light. The term "MCP" shall be construed to mean a micro channel plate. The term "charge-coupled device" or "CCD" shall be construed to mean a self-scanning charge-coupled device. The term "charge-coupled device" or "CCD" shall be construed to mean a conventional charge coupled device with register areas protected from atomic particles when the CCD is used to detect atomic particles, any conventional CCD or a conventional CCD with memory capability when the CCD is used in an intensifier that processes X-rays, and a conventional CCD with storage capability when the CCD is used in the photon bombardment mode. The terms "incident beam" and "beam" shall be construed to mean incident light and particles. The term "particle" shall include photons and atomic particles. The term "electrical signal" shall include analog and digital signals.

BRIEF DESCRIPTION OF THE DRAWINGS

To enhance the understanding of the detailed description of the preferred embodiment below, reference may be had to the drawing in which.

DETAILED DESCRIPTION OF THE PREFERRED EMBODIMENT

Figure 1:
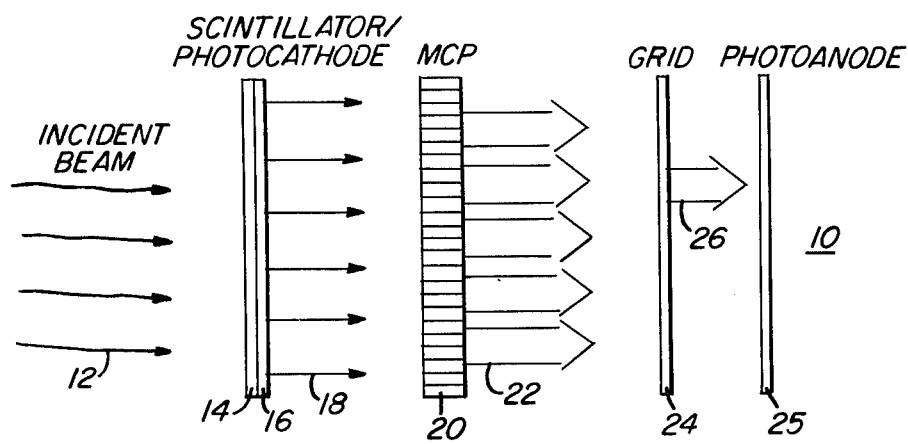
FIG. 1 is a schematic diagram of an image intensifier constructed according to the provisions of the present invention that includes a scanning grid as an electron detector.

FIG. 1 depicts a light or particle image intensifier 10 that includes a scanning grid 24 and a photoanode 25 for detecting electrons 22. An incident beam 12 impacts scintillator 14 thereby causing photons (not shown) to impact photocathode 16. Photocathode 16 can be any photocathode suitable for converting photons to photoelectrons. Scintillator 14 produces photons of a wavelength such that a maximum quantity of photo-electrons 18 are produced by photocathode 16 when it is impacted by a photon emitted by scintillator 14. The material comprising the scintillator can be matched to the type of beam to be detected. To detect X-rays, gamma-rays, infra-red light ultraviolet light and atomic particles the scintillator should be made of any of the materials listed below:

NaI (Tl)
CsI (Tl)
CsI (Na)
$CaF_2$ (Eu)
$^6Li$ (Eu)
TlCl (BeI)
CsF
$BaF_2$
$Bi_4Ge_3O_{12}$
Ki (Tl)
$CaWO_4$
$CdWO_4$

If visible light is to be detected, the scintillator should be eliminated.

Figure 2:
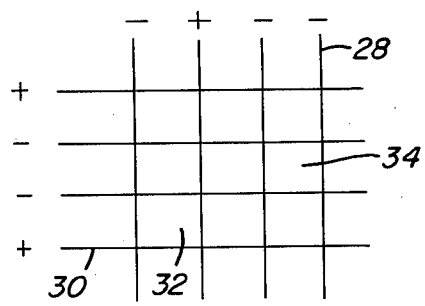
FIG. 2 is a schematic view of a portion of the scanning grid shown in FIG. 1.

Photoelectrons 18, emitted by photocathode 16, are accelerated by an electric potential (not shown) established between photocathode 16 and a conventional MCP 20 and enter MCP 20. The electric field between photocathode 16 and MCP 20 can be approximately 300 volts. Preferably a 1 KV to 2 KV field is imposed across MCP 20 in which case MCP 20 multiplies the number of photoelectrons entering MCP 20 by $10^4$ to $10^6$. Secondary electrons 22, emitted from MCP 20, are accelerated by an electric field established between MCP 20 and a scanning grid 24 and travel toward scanning grid 24. The electric potential between MCP 20 and grid 24 can be approximately 300 V. A portion of scanning grid 24 is shown in FIG. 2. Scanning grid 24 is composed of vertical leads 28 disposed in a position such that they are in contact with horizontal leads 30 and form grid windows 32. Vertical leads 28 are electrical insulated from horizontal leads 30 in any suitable fashion and are energized by a suitable electric source. A grid window 32 allows electrons 22 to pass through grid 24 (e.g. electrons 26 in FIG. 1) only if all four leads forming its boundaries are of the same polarity. If the leads forming a window 32 have two different polarities, the electrons will not be passed by the window but will be absorbed by the grid. It can be seen, therefore, that the beam of electrons 22 can be systematically scanned by permitting only one window (such as window 34) at a time to have boundaries of the same polarity and to change that window in a systematic fashion. Electrons 26 impact a conventional photoanode 25 which passes the information contained in each passed beam 26 relating to position and intensity of electrons 22 in any known fashion to data processing and video equipment (not shown) where an image is produced and displayed on a CRT. An electric field is established in any suitable fashion for accelerating the passed electrons 26 toward the photoanode 25. That field can be 100 volts. An electric field of 1 KV-2 KV can be set up across MCP 20 to facilitate the production of secondary electrons 22 by MCP 20.

Figure 3:
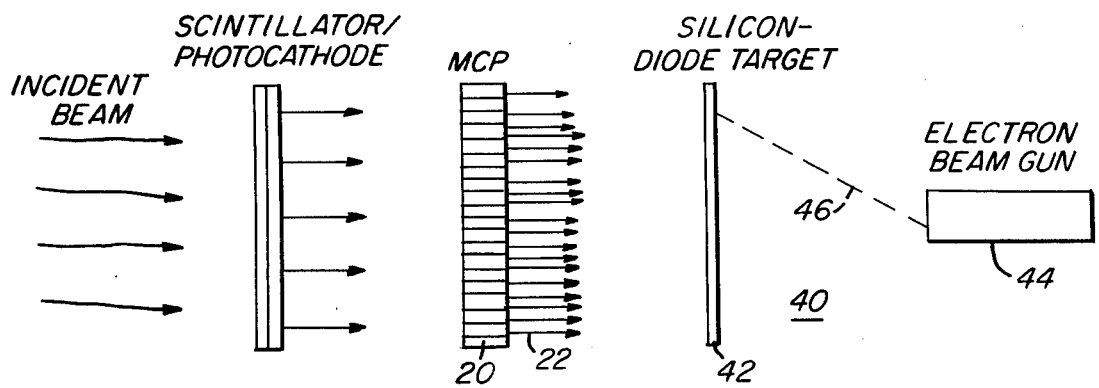
FIG. 3 is a schematic diagram of an image intensifier constructed according to the provisions of the present invention that includes a silicon diode target and an electron beam gun as an electron detector.

FIG. 3 shows another embodiment 40 of the present invention which is similar to image intensifier 10 but which detects electrons 22 by using silicon diode target 42 and electron beam gun 44 instead of a scanning grid and photoanode. Electrons 22 impact on target 42 and create charges in the target 42. A conventional electron beam gun 44 scans target 42 with an electron beam 46. The charges created by electrons 22 impacting on target 42 are detected by beam 46 and information relating to the location and intensity of the charges is transmitted in any known fashion to the data processing and video equipment from which an image is constructed and displayed. Again an electric field of approximately 1 KV should be established in any known fashion between MCP 20 and target 42 to accelerate electrons 22 toward target 42. An electric field of approximately 20 KV should be set up between target 42 and electron gun 44.

Figure 4:
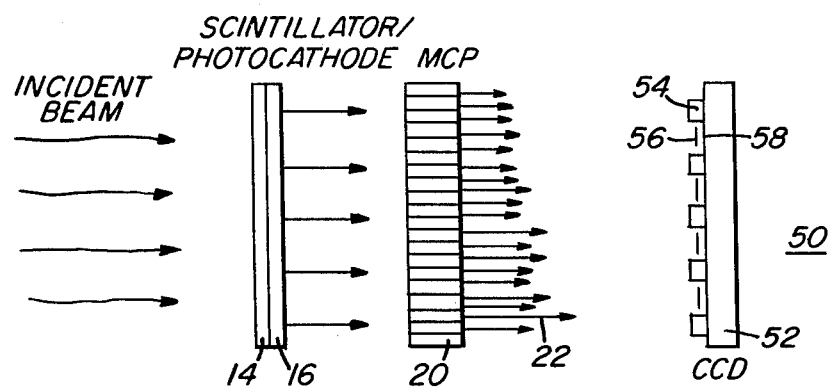
FIG. 4 is a schematic diagram of an image intensifier constructed according to the provisions of the present invention that includes a CCD as an electron or photon detector.

Another preferred embodiment 50 is shown in FIG. 4. This embodiment is similar to image intensifiers 10 and 40, but detects electrons 22 by a self-scanning CCD 52 (see FIGS. 6 and 7). An electric field of 300 volts is established between MCP 20 and CCD 52. CCD 52 can be a device, such as a semiconductor chip, having sensing and register areas common to conventional CCDs but having the additional feature of storage areas for storing information sensed by the sensing areas, for passing such information to the register areas and for accepting image-conveying external analog electrical inputs from sources other than the sensing areas (such as the register areas). Alternately, CCD 52 can be a conventional CCD having only sensing and register areas. Sensing areas 54 detect electrons 22. Electrons 22 impacting sensing areas 54 create charges on the photo diode sensors 60 formed therein (see FIG. 7). These charges are transferred to the register areas 58 of the CCD. If a CCD having storage areas is desired, areas 58 of CCD 52 contain those storage areas. The equivalent circuit for each sensing and storage area is shown schematically in FIG. 7. When switch S1 is in position 1, sensor diode 60 is being charged by source $V_{DD}$ preparatory to detecting electrons 22; switch S2 can be placed in position 2 to transfer information contained in the storage area to the register area through field effect transistor F2 or it can be in position 1 whereby no transfer takes place. When switch S1 is in position 2, switch S2 can be placed in position 2 and information from the register area can be read into the storage area through field effect transistor F1. Also, when switch S1 is in position 2, sensing diode 60 can detect the presence of electrons 22. When switch S1 is in position 3, information is moved from sensing diode 60 to the storage area. Capacitor C1 allows information to flow from the storage area to the register area non-destructively. The length of time during which information can be stored in the storage areas is limited only by the leakage rate of capacitor C1. As long as capacitor C1 is charged, F2 can be triggered and information can be passed from the storage area to the register area. When image intensifier 50 is being used to create an image conveyed by light or particles, the sequence of switching is as follows:
1. S1 in position 1 (sensor charging), S2 in position 1
2. S1 in position 2 (sensor reading), S2 in position 1
3. S1 in position 3 (transfer from sensor to storage), S2 in position 1
4. S1 in position 1 (sensor charging), S2 in position 2 (transfer from storage to register) (sensor ready)
5. Read out register areas to data processing and video equipment
6. Repeat steps 2., through 6.

Figure 6:
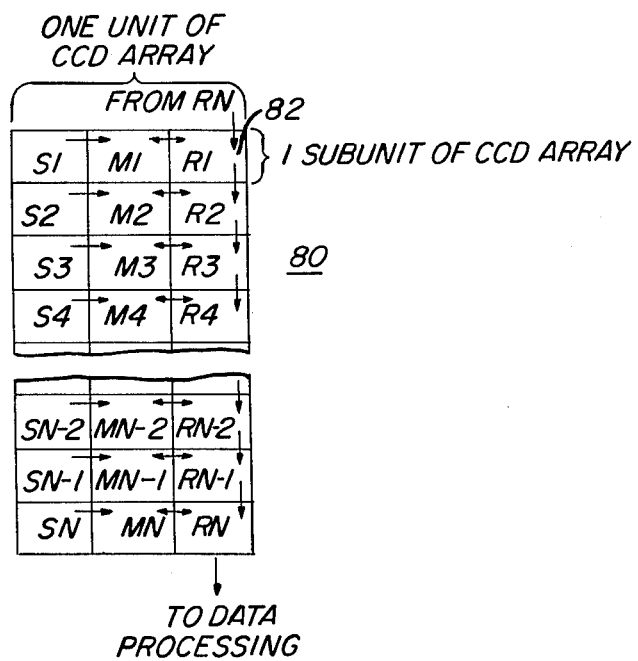
FIG. 6 is a schematic diagram of the sensing, storage and register areas of one unit of a CCD that can be constructed according to the provisions of the present invention; and, FIG. 7 is an electrical equivalent circuit of the sensing and storage areas of a CCD that can be constructed according to the provisions of the present invention.
Figure 7:
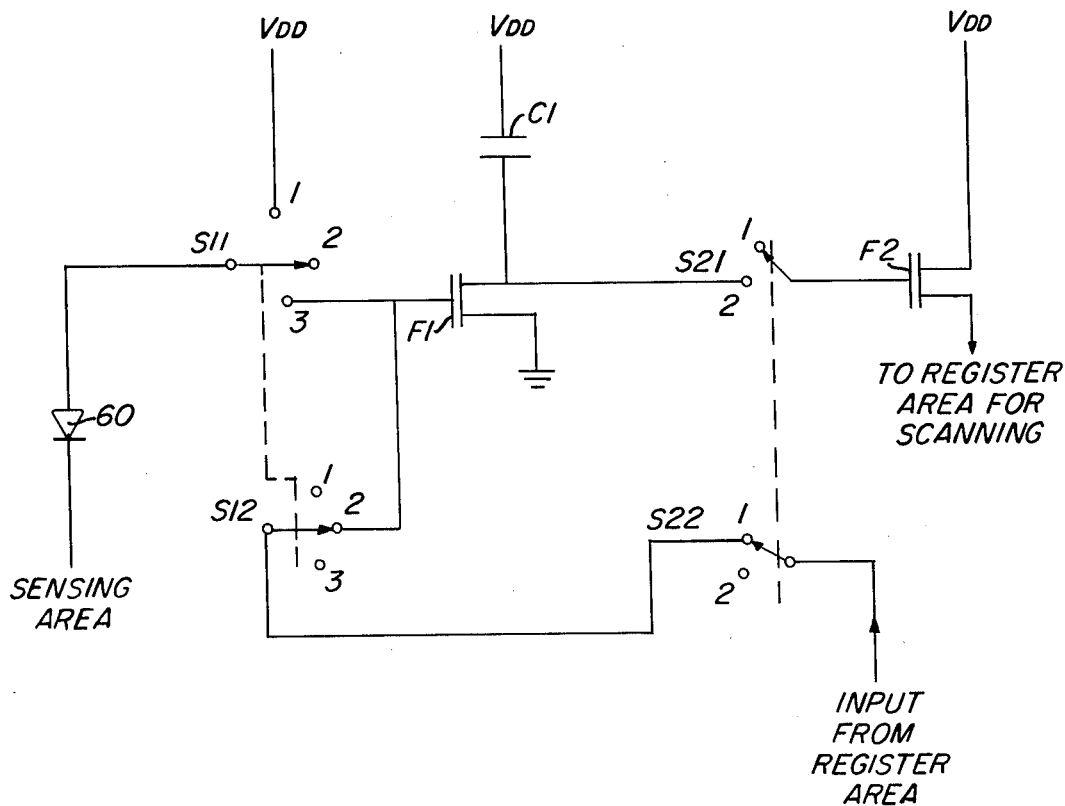

FIG. 6 depicts schematically one unit 80 of the CCD array 52. Units 80 are bonded together in any suitable fashion to form CCD array 52. The sensing areas of unit 80, S1 to SN, pass information to the storage areas, M1 to MN. Storage areas M1 to MN pass information to output register areas R1 to RN. The register areas are read out or "scanned" in serial fashion to the data processing and video equipment. The scanning sequence is as follows:
1. Move R1 to R2, R2 to R3, . . . , RN−1 to RN, RN to data processing
2. Move R2 to R3, . . . , RN−1 to RN, RN to data processing X. Move RN−2 to RN−1 to RN, RN to data processing
X+1. Move RN−1 to RN, RN to data processing
X+2. Move RN to data processing.

Alternately, the information in register area RN is moved to register area R1 each time it is moved from RN to the data processing equipment. This feature not only allows unit 80 to retain the information read out from the register units, but allows information to be read into the register areas from an external buffer. Each time information is read from register area RN, it is combined with the corresponding information from all the register areas RN of the other array units 80 to obtain one line of the image. Preferably, since the storage area can be read nondestructively, after step 4 above, switch S2 can alternate between positions 1 and 2 until the sensing diode is charged and new information sensed thereby. The sequence of switching would be as follows:
1. S1 in position 2 and S2 in position 1
2. S1 in position 3 and S2 in position 1
3. S1 in position 1 and S2 in position 2 (transfer from storage to register area)
4. Read out register areas
5. S2 in position 1
6. S2 in position 2
7. Read out register areas
8. S2 in position 1
9. S2 in position 2
10. Read out register areas
.
.
.
X. S1 in position 2 and S2 in position 1
X+1. S2 in position 2
X+2 Read out register areas
.
.
.
Y. S1 in position 3 and S2 in position 1.
Y+1. Repeat steps 2 through Y+1.

This sequence ensures that the displayed image will appear continuous. It is preferable that 9 readouts of the register area occur for every read by the sensing area. It can be seen that a similar sequence can be used when images are created from the external analog input.

Moreover, it is preferable that register area 1 (see FIG. 6) be able to receive information from an external source. This would enable the register areas to accept information from an external source and read that information into the storage areas via switch S2.

A CCD 52 having sensing, storage and register areas can be constructed using any of the well-known procedures for producing chips. The CCD 52 can transfer information between the sensing and storage areas, the storage and register and among the register areas in the same fashion that information is transferred within conventional CCDs.

Figure 5:
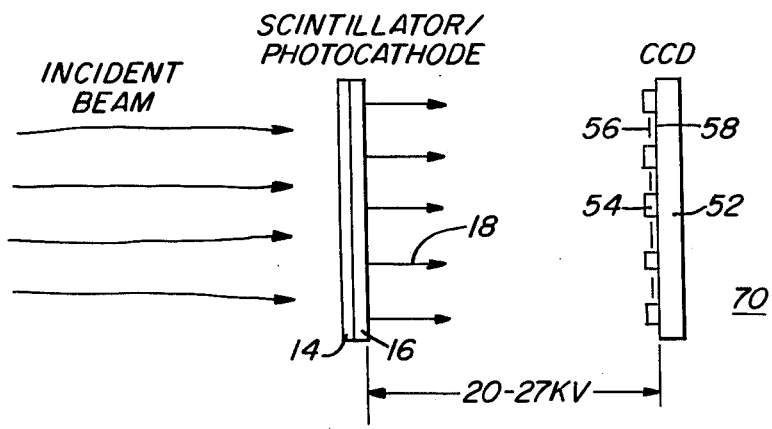
FIG. 5 is a schematic diagram of an image intensifier constructed according to the provisions of the present invention that employs a potential field rather than an MCP for improving system resolution.

Another preferred embodiment 70 of the present invention is shown in FIG. 5. This embodiment is identical to image intensifier 50, except that a 20–27 KV electric field is used to improve electron gain instead of an MCP.

It should be noted that visible light can be detected directly by CCD 52 and, accordingly, scintillator 14 or scintillator 14, photocathode 16 and MCP 20 can be eliminated (see FIGS. 4 and 5).

The components of the present invention that must be enclosed in a glass vacuum envelope can be so enclosed in any known fashion. Electrical communication between the enclosed components and external equipment can be accomplished in any known fashion. The scintillator may be disposed inside or outside the glass envelope. If it is desired to bombard the CCD with atomic particles, the CCD should be disposed inside the glass envelope. If it is desired to bombard the CCD with photons, the CCD can be disposed inside or outside the glass envelope.

The following list sets forth preferred specificatons for the present invention:

Size of one channel of MCP—40 microns
Distance between photocathode and MCP—1 to 2 mm
Distance between photocathode and CCD—10 to 20 mm
Distance between MCP and CCD—1 to 2 mm
Distance between MCP and scanning grid—10 mm
Distance between scanning grid and photoanode—10 mm
Distance between MCP and silicon diode target—1 to 2 mm
Distance between silicon diode target and electron beam gun—10-15 inches
Number of channels in MCP for 6 inch sensor—6 M
Size of each scanning grid window—40 microns
Amount of voltage on scanning grid leads—approximately 40 Volts
Potential across MCP to achieve gain of 10–2 KV.

What is claimed is:

1. An image intensifier for processing a beam and providing to data processing and video equipment information needed by said equipment to construct and display the image conveyed by said beam, said image intensifier comprising:
   a scintillator screen for intercepting said beam and for emitting photons as a response to the particles of said beam impacting said screen;
   a photocathode for intercepting said emitted photons and emitting photoelectrons in response to the impact of said emitted photons on said photocathode;
   a charge-coupled device, said photocathode being disposed between said scintillator screen and said charge-coupled device, said charge-coupled device intercepting and detecting said photoelectrons and transmitting to said data processing and video equipment information relating to the presence and location of said photoelectrons, said charge-coupled device including:
      a plurality of sensing areas for intercepting and detecting said photoelectrons;
      a pluality of storage areas for accepting from said sensing areas informatin relating to the location and presence of said photoelectrons;
      sensor to storage transfer means for transferring said information from said sensing areas to said storage areas;
      storage areas including means for allowing said storage areas to receive analog electrical signals from a source other than said sensing areas;
      a plurality of register areas for receiving said information from said storage areas and for transferring said information to said data processing and video equipment;
      storage to register transfer means for transferring said information from said storage areas to said register areas;
      readout means for reading said information from said register areas; and
      shielding means covering said storage and register areas for protecting said storage and register areas from said photoelectrons; and
   means for accelerating said photoelectrons toward said charge-coupled device.

2. The image intensifier claimed in claim 1 wherein said analog electrical signal source is said register areas.

3. An image intensifier for processing a beam and providing to data processing and video equipment information needed by said equipment to construct and display the image conveyed by said beam, said image intensifier comprising:
   a scintillator screen for intercepting said beam and for emitting photons as a response to the particles of said beam impacting said screen;
   a photocathode for intercepting said emitted photons and emitting photoelectrons in response to the impact of said emitted photons on said photocathode;
   a charge-coupled device, said photocathode being disposed between said scintillator screen and said charge-coupled device, said charge coupled device intercepting and detecting said photoelectrons and transmitting to said data processing and video equipment information relating to the presence and location of said photoelectrons, said charge-coupled device including:
      a pluraltiy of sensing areas for intercepting and detecting said photoelectrons;
      a plurality of storage areas for accepting from said sensing areas information relating to the location and presence of said photoelectrons;
      sensor to storage transfer means for transferring said information from said sensing areas to said storage areas;
      a plurality of register areas for receiving said information from said storage areas and for transferring said information to said data processing and video equipment;
      storage to register transfer means for transferring said information from said storage areas to said register areas;
      said storage areas including means for allowing said information to pass from said storage areas to said register areas nondestructively;
      readout means for reading said information from said register areas; and
   shielding means covering said storage and register areas for protecting said storage and register areas from said photoelectons; and
   means for accelerating said photoelectrons toward said charge-coupled device.

4. An image intensifier for processing a beam and providing to data processing and video equipment information needed by said equipment to construct and display the image conveyed by said beam, said image intensifier comprising:
   a scintillator screen for intercepting said beam and for emitting photons as a response to the particles of said beam impacting said screen;

a photocathode for intercepting said emitted photons and emitting photoelectrons in response to the impact of said emitted photons on said photocathode;

a charge-coupled device, said photocathode being disposed between said scintillator screen and said charge-coupled device, said charge-coupled device intercepting and detecting said photoelectrons and transmitting to said data processing and video equipment information relating to the presence and location of said photoelectrons;

means for accelerating said photoelectrons toward said charge-coupled device; and a phosphor screen disposed between said photocathode and said charge-coupled device for emitting secondary photons as a response to said photoelectrons impacting said phosphor screen.

5. An image intensifier for processing a beam and providing to data processing and video equipment information needed by said equipment to construct and display the image conveyed by said beam, said image intensifier comprising:

a scintillator screen for intercepting said beam and for emitting photons as a response to the particles of said beam impacting said screen;

a photocathode for intercepting said emitted photons and emitting photoelectrons in response to the impact of said emitted photons on said photocathode;

a charge-coupled device, said photocathode being disposed between said scintillator screen and said charge-coupled device, said charge-coupled device intercepting and detecting said photoelectrons and transmitting to said data processing and video equipment information relating to the presence and location of said photoelectrons, said charge-coupled device including:

a plurality of sensing areas for intercepting and detecting said photelectrons;

a plurality of storage areas for accepting from said sensing areas information relating to the location and presence of said photoelectrons;

sensor to storage transfer means for transferring said information from said sensing areas to said storage areas;

a plurality of register areas for receiving said information from said storage areas and for transferring said information to said data processing and video equipment;

storage to register transfer means for transferring said information from said storage areas to said register areas;

readout means for reading said information from said register areas; and shielding means covering said storage and register areas for protecting said storage and register areas from said photoelectrons;

a micro channel plate disposed between said photocathode and said charge-coupled device for receiving said photoelectrons and emitting toward said charge-coupled device secondary electrons, the quantity of said secondary electrons being greater than the quantity of said photoelectrons;

means for accelerating said secondary electrons toward said charge-coupled device; and means for accelerating said photoelectrons toward said charge-coupled device.

6. The image intensifier claimed in claim 5, wherein said means for accelerating said secondary electrons is an electric field.

7. An image intensifier for processing a beam and providing to data processing and video equipment information needed by said equipment to construct and display the image conveyed by said beam, said image intensifier comprising:

a scintillator screen for intercepting said beam and for emitting photons as a response to the particles of said beam impacting said scintillator screen:

a photocathode for intercepting said emitted photons and emitting photoelectrons in response to the impact of said emitted photons on said photocathode;

a micro channel plate for emitting secondary electrons in response to the reception of photoelectrons by said micro channel plate, the quantity of said secondary electrons being greater than the quantity of said photoelectrons;

means for detecting the presence, intensity and location of said secondary electrons, said microchannel plate being disposed between said photocathode and said detection means, said means transmitting information relating to said presence, location and intensity to said data processing and video equipment;

means for accelerating said photoelectrons toward said micro channel plate; and, means for accelerating said secondary electrons toward said detection means.

8. The image intensifier claimed in claim 7 wherein said detection means comprises:

a silicon diode target, said secondary electrons creating a charge in said target where said secondary electrons strike said target;

an electron beam gun, said target being disposed between said micro channel plate and said electron beam gun, said electron beam gun scanning said target and passing information relating to the presence, location and intensity of said charges to said data processing and video equipment, and an electric field imposed across said target and said gun.

9. The image intensifier claimd in claim 7 wherein said incident beam comprises X-ray radiation.

10. The imge intensifier claimed in claim 7 wherein said incident beam comprises gamma-ray radiation.

11. The image intensifier claimed in claim 7 wherein said incident beam comprises atomic particles.

12. The image intensifier claimed in claim 7 wherein said incident beam comprises infra-red light.

13. The image intensifier claimed in claim 7 wherein said incident beam comprises ultraviolet light.

14. The image intensifier claimed in claim 7 wherein said detection means comprises:

a photoanode;

a scanning grid for scanning said secondary electrons by selectively and systematically allowing a portion of said secondary electrons to pass through said grid, said scanning grid being disposed between said micro channel plate and said photoanode;

said photoanode passing to said data processing and video equipment information relating to the presence, location and energy level of said secondary electrons; and, means for accelerating said passed secondary electrons toward said photoanode.

15. The image intensifier claimed in claim 14 wherein said means for accelerating said passed electrons is an electric field.

16. A visible light image intensifier for processing a visible light beam and providing to data processing and video equipment information needed by said equipment to construct and display the image conveyed by said beam, said image intensifier comprising:
- a photocathode for intercepting said beam and emitting photoelectrons in response to the impact of the photons of said beam on said photocathode;
- a charge-coupled device for intercepting and detecting said photoelectrons and transmitting to said data processing and video equipment information relating to the presence and location of said photoelectrons, said charge-coupled device including:
- a plurality of sensing areas is intercepting and detecting said photoelectrons;
- a pluraltiy of storage areas for accepting from said sensing areas information relating to the location and presence of said photoelectrons;
- sensor to storage transfer means for transferring said information from said sensing areas to said storage areas;
- said storage areas including means for allowing said storage areas to receive electrical signals from a source other than said sensing areas;
- a plurality of register areas for receiving said information from said storage areas and for transferring said information to said data processing and video equipment;
- storage to register transfer means for transferring said information from said storage areas to said register areas;
- readout means for reading said information from said register areas; and
- shielding means covering said storage and register areas for protecting said storage and register areas from said photoelectrons; and
- means for accelerating said photoelectrons toward said charge-coupled device.

17. The visible light image intensifier claimed in claim 16 wherein said electrical signal source is said register areas.

18. A visible light image intensifier for processing a visible light beam and providing to data processing and video equipment information needed by said equipment to construct and display the image conveyed by said beam, said image intensifier comprising:
- a photocathode for intercepting said beam and emitting photoelectrons in response to the impact of the photons of said beam on said photocathode;
- a charge-coupled device for intercepting and detecting said photoelectrons and transmitting to said data processing and video equipment information relating to the presence and location of said photoelectrons, said charge-coupled device including:
- a plurality of sensing areas for intercepting and detecting said photoelectrons;
- a plurality of storage areas for accepting from said sensing areas information relating to the location and presence of said photoelectrons;
- sensor to storage transfer means for transferring said information from said sensing areas to said storage areas;
- a plurality of register areas for receiving said information from said storage areas and for transferring said information to said data processing and video equipment;
- storage to register transfer means for transferring said information from said storage areas to said register areas;
- said storage areas including means for allowing said information to pass from said storage areas to said register areas nondestructively;
- readout means for reading said informaton from said register areas; and
- shielding means covering said storage and register areas for protecting said storage and register areas from said photoelectrons; and
- means for accelerating said photoelectrons toward said charge-coupled device.

19. A visible light image intensifier for processing a visible light beam and providing to data processing and video equipment information needed by said equipment to construct and display the image conveyed by said beam, said image intensifier comprising:
- a photocathode for intercepting said beam and emitting photoelectrons in response to the impact of the photons of said beam on said photocathode;
- a charge-coupled device for intercepting and detecting said photoelectrons and transmitting to said data processing and video equipment information relating to the presence and location of said photoelectrons;
- means for accelerating said photoelectrons toward said charge-coupled device; and
- a phosphor screen disposed between said photocathode and said charge-coupled device for emitting secondary photons as a response to said photoelectrons impacting said phosphor screen.

20. A visible light image intensifier for processing a visible light beam and providing to data processing and video equipment information needed by said equipment to construct and display the image conveyed by said beam, said image intensifier comprising:
- a photocathode for intercepting said beam and emitting photoelectrons in response to the impact of the photons of said beam on said photocathode;
- a charge-coupled device for intercepting and detecting said photoelectrons and transmitting to said data processing and video equipment information relating to the presence and location of said photoelectrons, said charge-coupled device including:
- a plurality of sensing areas for intercepting and detecting said photoelectrons;
- a plurality of storage areas for accepting from said sensing areas information relating to the location and presence of said photoelectrons;
- sensor to storage transfer means for transferring said information from said sensing areas to said storage areas;
- a plurality of register areas for receiving said information from said storage areas and for transferring said information to said data processing and video equipment;
- storage to register transfer means for transferring said information from said storage areas to said register areas;
- readout means for reading said information from said register areas; and
- shielding means covering said storage and register areas for protecting said storage and register areas from said photoelectrons;

a micro channel plate disposed between said photocathode and said charge-coupled device for receiving said photoelectrons and emitting toward said charge-coupled device secondary electrons, the quantity of said secondary electrons being greater than the quantity of said photoelectrons;

means for accelerating said secondary electrons toward said charge-coupled device; and means for accelerating said photoelectrons toward said charge-coupled device.

21. The visible light image intensifier claimed in claim 20 wherein said means for accelerating said secondary electrons is an electric field.

22. An image intensifier for processing a beam and providing to data processing and video equipment information needed by said equipment to construct and display the image conveyed by said beam, said image intensifier comprising:

a photocathode for intercepting said beam and emitting photoelectrons in response to the impact of the particles of said beam on said photocathode;

a micro channel plate for emitting secondary electrons in response to the reception of photoelectrons by said micro channel plate, the quantity of said secondary electrons being greater than the quantity of said photoelectrons;

means for detecting the presence, intensity and location of said secondary electrons and for transmitting information relating to said presence, location and intensity to said data processing and video equipment, said detection means including:

a silicon diode target, said secondary electrons creating a charge in said target where said secondary electrons strike said target; and an electron beam gun, said target being disposed between said micro channel plate and said electron beam gun, said electron beam gun scanning said target and passing information relating to the presence, location and intesity of said charges to said data processing and video equipment, and an electric field imposed across said target and said gun;

means for accelerating said photoelectrons toward said micro channel plate;

means for accelerating said secondary electrons toward said detection means.

23. An image intensifier for processing a beam and providing to data processing and video equipment information needed by said equipment to construct and display the image conveyed by said beam, said image intensifier comprising:

a photocathode for intercepting said beam and emitting photoelectrons in response to the impact of the particles of said beam on said photocathode;

a micro channel plate for emitting secondary electrons in response to the reception of photoelectrons by said micro channel plate, the quantity of said secondary electrons being greater than the quantity of said photoelectrons;

means for detecting the presence, intensity and location of said secondary electrons and for transmitting information relating to said presence, location and intensity to said data processing and video equipment, said detection means including:

a photoanode;

a scanning grid for scanning said secondary electrons by selectively and systematically allowing a portion of said secondary electrons to pass through said grid, said scanning grid being disposed between said micro channel plate and said photoanode;

said photoanode passing to said data processing and video equipment information relating the presence, location and energy level of said secondary electrons; and means for accelerating said passed secondary electrons toward said photoanode;

means for accelerating said photoelectrons toward said micro channel plate; and means for accelerating said secondary electrons toward said detection means.

24. The image intensifier claimed in claim 23 wherein said means for accelerating said passed electrons is an electric field.

25. A charge-coupled device for detecting particles and conveying to data processing and video equipment data necessary to permit said equipment to reconstruct and display an image conveyed by said particles, said charge-coupled device comprising:

a plurality of sensing areas for intercepting and detecting said particles;

a plurality of storage areas for accepting from said sensing areas information relating to the location and presence of said particles;

sensor to storage transfer means for transferring said information from said sensing areas to said storage areas;

a plurality of register areas for receiving said information from said storage areas and for transferring said information to said data processing and video equipment;

storage to register transfer means for transferring said information from said storage areas to said register areas;

readout means for reading said information from said register areas; and means for shielding said register and storage areas from atomic particles.

26. The charge-coupled device claimed in claim 25 wherein said storage areas include means for allowing said storage areas to receive electrical signals from a source other than said sensing areas.

27. The charge-coupled device claimed in claim 26 wherein said electrical signal source is said register areas.

28. A charge-coupled device for detecting particles and conveying to data processing and video equipment data necessary to permit said equipment to reconstruct and display an image conveyed by said particles, said charge-coupled device comprising:

a plurality of sensing areas for intercepting and detecting said particles;

a plurality of storage areas for accepting from said sensing areas information relating to the location and presence of said particles;

sensor to storage transfer means for transferring said information from said sensing areas to said storage areas;

a plurality of register areas for receiving said information from said storage areas and for transferring said information to said data processing and video equipment;

storage to register transfer means for transferring said information from said storage areas to said register areas;

said storage areas including means for allowing said information to pass from said storage areas to said register areas nondestructively; and readout means for reading said information from said register areas.

* * * * *

UNITED STATES PATENT AND TRADEMARK OFFICE
CERTIFICATE OF CORRECTION

PATENT NO. : 4,471,378
DATED : September 11, 1984
INVENTOR(S) : Sing Tai Ng

It is certified that error appears in the above—identified patent and that said Letters Patent is hereby corrected as shown below:

Col. 1, line 40, delete "immage" and substitute therefor --image--;

Col. 2, lines 17-18, delete "photo-elec-trons" and substitute therefor --photoelectrons--;

Col. 2, line 58, delete "systemically" and substitute therefor --systematically--;

Col. 2, line 66, delete "and" second occurrence and substitute therefor --are--;

Col. 4, line 30, delete "electrical" and substitute therefor --electrically--;

Col. 6, line 59, after "register" first occurrence insert --areas--;

Col. 7, line 34, delete "10-2" and substitute therefor --$10^6$-2-;

Col. 7, line 58, delete "pluality" and substitute therefor --plurality--;

Col. 10, line 44, delete "claimd" and substitute therefor --claimed--;

Col. 10, line 46, delete "imge" and substitute therefor --image--; and

UNITED STATES PATENT AND TRADEMARK OFFICE
CERTIFICATE OF CORRECTION

PATENT NO. : 4,471,378

DATED : September 11, 1984

INVENTOR(S) : Sing Tai Ng

It is certified that error appears in the above-identified patent and that said Letters Patent is hereby corrected as shown below:

Column 11, line 17, delete "is" and substitute therefor

-- for --.

Signed and Sealed this

Ninth Day of December, 1986

Attest:

DONALD J. QUIGG

Attesting Officer

Commissioner of Patents and Trademarks